United States Patent
Su

(10) Patent No.: US 8,744,832 B2
(45) Date of Patent: Jun. 3, 2014

(54) HYBRID ELECTRONIC DESIGN SYSTEM AND RECONFIGURABLE CONNECTION MATRIX THEREOF

(75) Inventor: Peisheng Alan Su, Hsinchu County (TW)

(73) Assignee: Global Unichip Corporation, Hsinchu (TW)

( * ) Notice: Subject to any disclaimer, the term of this patent is extended or adjusted under 35 U.S.C. 154(b) by 0 days.

(21) Appl. No.: 12/973,956

(22) Filed: Dec. 21, 2010

(65) Prior Publication Data

US 2012/0110525 A1 May 3, 2012

(30) Foreign Application Priority Data

Nov. 2, 2010 (TW) ................................ 99137570 A

(51) Int. Cl.
*G06F 17/50* (2006.01)
*G06F 7/60* (2006.01)

(52) U.S. Cl.
CPC .................................. *G06F 17/5027* (2013.01)
USPC .................. 703/23; 703/24; 703/25; 703/26; 703/27; 703/28

(58) Field of Classification Search
USPC ..................................................... 703/23–28
See application file for complete search history.

(56) References Cited

U.S. PATENT DOCUMENTS

| | | | | |
|---|---|---|---|---|
| 5,761,484 A * | 6/1998 | Agarwal et al. | .................. | 326/38 |
| 5,777,489 A * | 7/1998 | Barbier et al. | .................. | 326/40 |
| 5,841,967 A * | 11/1998 | Sample et al. | .................. | 714/33 |
| 6,006,022 A * | 12/1999 | Rhim et al. | ..................... | 716/102 |
| 6,009,256 A * | 12/1999 | Tseng et al. | ..................... | 703/13 |
| 6,026,230 A * | 2/2000 | Lin et al. | .......................... | 703/13 |
| 6,057,706 A * | 5/2000 | Barbier et al. | .................. | 326/39 |
| 6,058,492 A * | 5/2000 | Sample et al. | .................. | 714/33 |
| 6,265,894 B1 * | 7/2001 | Reblewski et al. | .............. | 326/39 |
| 6,279,146 B1 * | 8/2001 | Evans et al. | ..................... | 716/113 |
| 6,289,494 B1 * | 9/2001 | Sample et al. | .................. | 716/104 |
| 6,311,149 B1 * | 10/2001 | Ryan et al. | ....................... | 703/21 |
| 6,388,465 B1 * | 5/2002 | Barbier et al. | .................. | 326/40 |
| 6,412,104 B1 * | 6/2002 | Tseng | ............................ | 717/124 |
| 6,446,249 B1 * | 9/2002 | Wang et al. | ....................... | 326/38 |
| 6,480,952 B2 * | 11/2002 | Gorishek et al. | .............. | 712/227 |
| 6,539,535 B2 * | 3/2003 | Butts et al. | ....................... | 716/102 |
| 6,570,404 B1 * | 5/2003 | Norman et al. | .................. | 326/39 |
| 6,625,793 B2 * | 9/2003 | Sample et al. | .................. | 326/38 |
| 6,647,362 B1 * | 11/2003 | Reblewski et al. | .............. | 703/28 |
| 6,678,645 B1 * | 1/2004 | Rajsuman et al. | .............. | 703/20 |
| 6,694,464 B1 * | 2/2004 | Quayle et al. | .................. | 714/725 |
| 6,697,957 B1 * | 2/2004 | Wang et al. | ..................... | 713/401 |
| 6,717,433 B2 * | 4/2004 | Barbier et al. | .................. | 326/16 |
| 6,772,108 B1 * | 8/2004 | Stolowitz | ........................ | 703/27 |
| 6,785,873 B1 * | 8/2004 | Tseng | ............................ | 716/102 |
| 6,801,869 B2 * | 10/2004 | McCord | ......................... | 702/117 |
| 6,882,176 B1 * | 4/2005 | Norman et al. | .................. | 326/39 |

(Continued)

*Primary Examiner* — Shambhavi Patel
(74) *Attorney, Agent, or Firm* — Bacon & Thomas, PLLC

(57) ABSTRACT

A hybrid electronic design system and a reconfigurable connection matrix thereof are disclosed. The electronic design system includes a virtual unit, a hybrid unit and a communication channel. The virtual unit further includes a plurality of proxy units, a plurality of virtual components and a driver. The virtual components are connected with the driver via the proxy units. The hybrid unit further includes an emulate unit, a physical unit and a chip level transactor. The chip level transactor is connected with the emulate unit and the physical unit. The communication channel is connected with the driver of the virtual unit and the chip level transactor of the hybrid unit.

9 Claims, 6 Drawing Sheets

(56) References Cited

U.S. PATENT DOCUMENTS

| | | | |
|---|---|---|---|
| 6,947,882 B1* | 9/2005 | Reblewski et al. | 703/23 |
| 7,031,903 B2* | 4/2006 | Debling | 703/27 |
| 7,098,688 B2* | 8/2006 | Reblewski et al. | 326/41 |
| 7,152,027 B2* | 12/2006 | Andrade et al. | 703/21 |
| 7,209,874 B2* | 4/2007 | Salmonsen | 703/23 |
| 7,383,547 B1* | 6/2008 | Miri | 718/100 |
| 7,447,618 B2* | 11/2008 | Steffen | 703/14 |
| 7,471,220 B2* | 12/2008 | Mattes et al. | 341/120 |
| 7,472,054 B2* | 12/2008 | Garcia et al. | 703/25 |
| 7,472,055 B2* | 12/2008 | Garcia et al. | 703/25 |
| 7,483,825 B2 | 1/2009 | Van Huben et al. | |
| 7,987,086 B2 | 7/2011 | Van Huben et al. | |
| 8,346,530 B2* | 1/2013 | Reblewski | 703/16 |
| 8,374,842 B2* | 2/2013 | Amano et al. | 703/23 |
| 2002/0046016 A1* | 4/2002 | Debling | 703/28 |
| 2002/0089349 A1* | 7/2002 | Barbier et al. | 326/39 |
| 2003/0074178 A1* | 4/2003 | Sample et al. | 703/25 |
| 2004/0075469 A1* | 4/2004 | Reblewski et al. | 326/93 |
| 2004/0111252 A1* | 6/2004 | Burgun et al. | 703/28 |
| 2005/0039079 A1* | 2/2005 | Higashi et al. | 714/28 |
| 2006/0046819 A1* | 3/2006 | Nguyen et al. | 463/16 |
| 2008/0010524 A1* | 1/2008 | Higashi et al. | 714/28 |
| 2008/0016396 A1* | 1/2008 | Higashi et al. | 714/30 |
| 2008/0120082 A1 | 5/2008 | Alexanian et al. | |
| 2008/0120085 A1 | 5/2008 | Alexanian et al. | |
| 2008/0163143 A1 | 7/2008 | Kwon | |
| 2008/0263486 A1 | 10/2008 | Alexanian et al. | |
| 2009/0083683 A1 | 3/2009 | Snell | |
| 2009/0150136 A1 | 6/2009 | Yang | |
| 2010/0161306 A1* | 6/2010 | Burgun et al. | 703/20 |
| 2010/0198574 A1 | 8/2010 | Veller | |
| 2011/0041106 A1 | 2/2011 | Li et al. | |
| 2011/0184713 A1 | 7/2011 | Yang | |
| 2011/0289373 A1 | 11/2011 | Klein et al. | |
| 2011/0307847 A1 | 12/2011 | Liao et al. | |
| 2012/0017197 A1 | 1/2012 | Mehta | |

\* cited by examiner

HYBRID ELECTRONIC DESIGN SYSTEM AND RECONFIGURABLE CONNECTION MATRIX THEREOF

BACKGROUND OF THE INVENTION

1. Field of the Invention

The invention relates to a digital electronic design system, particularly to a hybrid electronic design system and a reconfigurable connection matrix thereof.

2. Description of the Prior Art

In the digital electronic design field, the IC designer can employ Verilog or VHDL to compile the Register Transfer Level (RTL) for hardware simulation. However, after entering into the Systematic-on-a-Chip (SoC) era, there are millions even hundred millions of Gate Count inside the SoC. The IC designer is difficult to finish the design from RTL abstraction level quickly under this situation.

Upon designing the SoC in RTL abstraction level, it is often necessary to consume a lot of time and calculation resources to carry out the simulation and verification, so that the time-to-market will be influenced. In addition, the IC designer will often face the predicaments, such as the transformation of different design tools, and difficult integration among the programming languages. Thus, the RTL verification is still a bottleneck in the digital circuit design.

Although some solutions are able to be adopted to support the functional model of fast and complete SoC simulation at present, it is often necessary to use SystemC and TLM 2.0 to develop the ESL virtual model of existing IP again, which will consume a lot of time and manpower. In addition, the execution speed is still slower than the physical IP.

SUMMARY OF THE INVENTION

The purpose of the invention is to provide a hybrid electronic design system and a reconfigurable connection matrix suitable for Electronic System Level (ESL), in order to solve the above-mentioned problems.

In order to reach the above-mentioned purpose, a hybrid electronic design system is disclosed according to the invention. The electronic design system includes a virtual unit, a hybrid unit and a communication channel. The virtual unit further includes a plurality of proxies, a plurality of virtual components and a driver. The virtual components are connected to the driver via the proxies. The hybrid unit further includes an emulating unit, a physical unit and a chip level transactor which is connected to the emulating unit and the physical unit. The communication channel connects the driver with the chip level transactor.

In order to reach the above-mentioned purpose, a reconfigurable connection matrix is disclosed according to the invention. The reconfigurable connection matrix is used to connect a virtual unit, an emulating unit and a physical unit. The virtual unit includes a driver. The emulating unit includes a plurality of emulating components and a first connection matrix. The physical unit includes a plurality of physical components and a second connection matrix, The above-mentioned reconfigurable connection matrix includes a plurality of first component transactors, a plurality of second component transactors, a plurality of buses, a configuration controller and a chip level transactor. The buses are connected to the first component transactors. The configuration controller is connected to the first connection matrix and the second connection matrix. The chip level transactor is connected to the driver of virtual unit, a plurality of first component transactors, a plurality of second component transactors and the configuration controller. The first connection matrix is connected to a plurality of buses and a plurality of second component transactors. The second connection matrix is connected to a plurality of buses and a plurality of second component transactors.

As the above-mentioned description, the hybrid electronic design system and the reconfigurable connection matrix of provided by the invention can be applied to SoC design, SoC design service, SoC design education and research. This hybrid design platform has the ability to solve the problem of too slow simulation speed for ESL virtual platform, and provide macro and micro architecture design, exploration and verification.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

As for the preferred embodiments of the invention, please refer to the following relevant Figures and description. The hybrid electronic design system and the reconfigurable connection matrix of provided by the preferred embodiments of the invention is suitable to be used in ESL design flow, in order to provide RTL verification, exploration of micro architecture, and exploration and verification of macro architecture.

Figure 1:
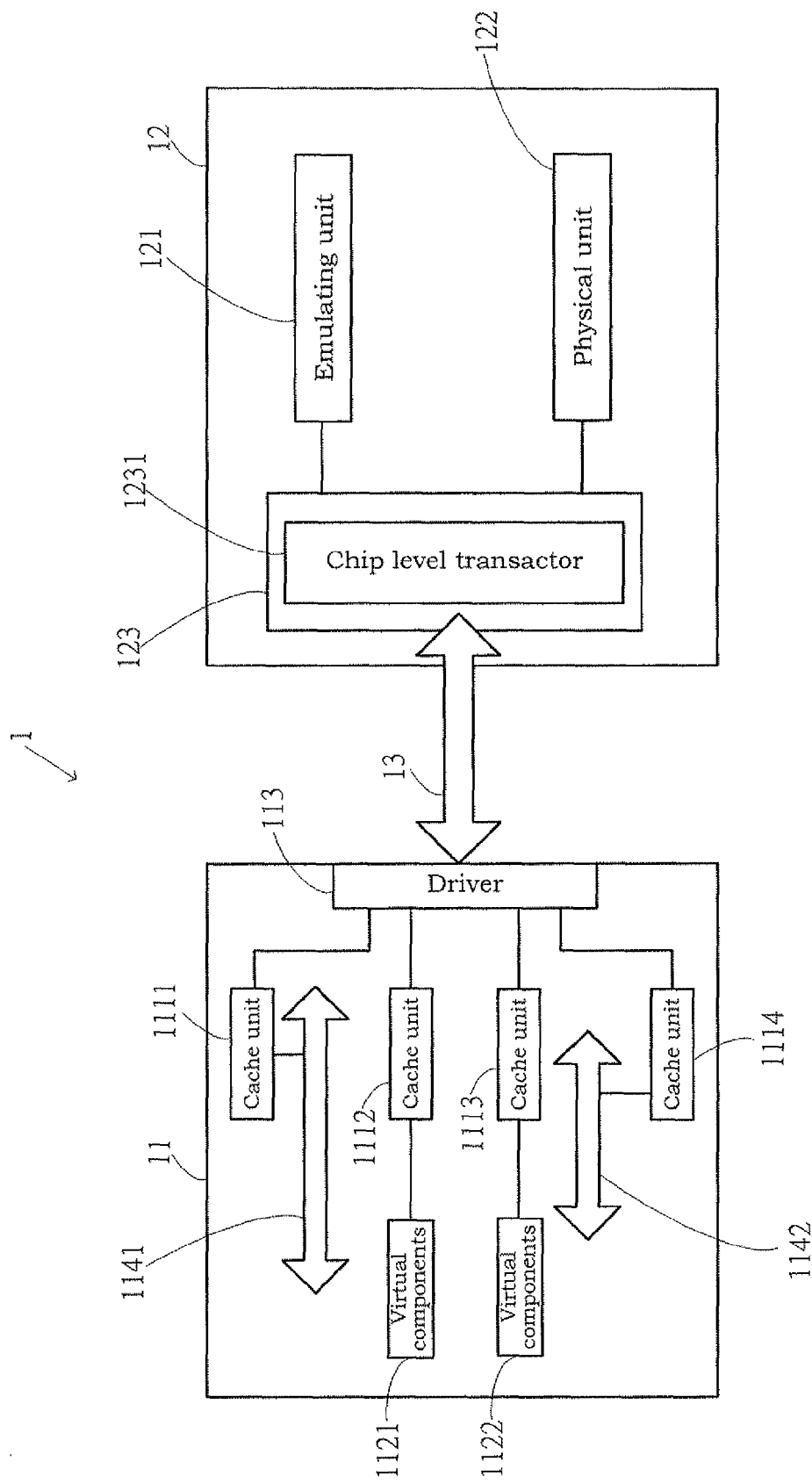
FIG. 1 is a graph illustrating the system architecture for a preferred embodiment of the invention.

FIG. 1 is a graph illustrating the system architecture for a preferred embodiment of the invention. As shown in FIG. 1, the electronic design system 1 includes a virtual unit 11, a hybrid unit 12 and a communication channel 13.

In the embodiment, the virtual unit 11 is also called the virtual platform, which includes TLM Models, SystemC Models and TLM general bus cache. In the embodiment, the 11 is installed in main workstation.

In the embodiment, the hybrid unit 12 is a physical plate, and the communication channel 13 is a physical communication apparatus, in order to connect the virtual unit 11 and the hybrid unit 12.

The above-mentioned virtual unit 11 includes a plurality of proxy unit 1111, proxy unit 1112, proxy unit 1113, proxy unit 1114, a plurality of virtual component 1121, virtual component 1122, a driver 113 and a plurality of bus 1141, bus 1142. In the embodiment, the proxy unit 1111, proxy unit 1112, proxy unit 1113, proxy unit 1114 and the driver 113 are implemented by the software. In the embodiment, the above-mentioned proxy unit 1112, proxy unit 1113 can be considered as the role of communicator, which is connected among the virtual component 1121, virtual component 1122 and the driver 113. It means the virtual component 1121, virtual component 1122 are connected to the driver 113 via the proxy unit 1112, proxy unit 1113.

The above-mentioned hybrid unit 12 includes an emulating unit 121, a physical unit 122 and a reconfigurable connection matrix 123, wherein the reconfigurable connection matrix 123 further includes a chip level transactor 1231.

In the embodiment, the chip level transactor 1231 is implemented by the hardware, which communicates with the driver 113 of the virtual unit 11 via the communication channel 13 mainly. In other words, the chip level transactor 1231 can be used to connect the driver 113. In addition, the chip level transactor 1231 also connects the emulating unit 121 and the physical unit 122.

As for the inside structure of the reconfigurable connection matrix 123 and the connection relation between the emulating unit 121 and the physical unit 122, it will further be described as follows.

Figure 2:
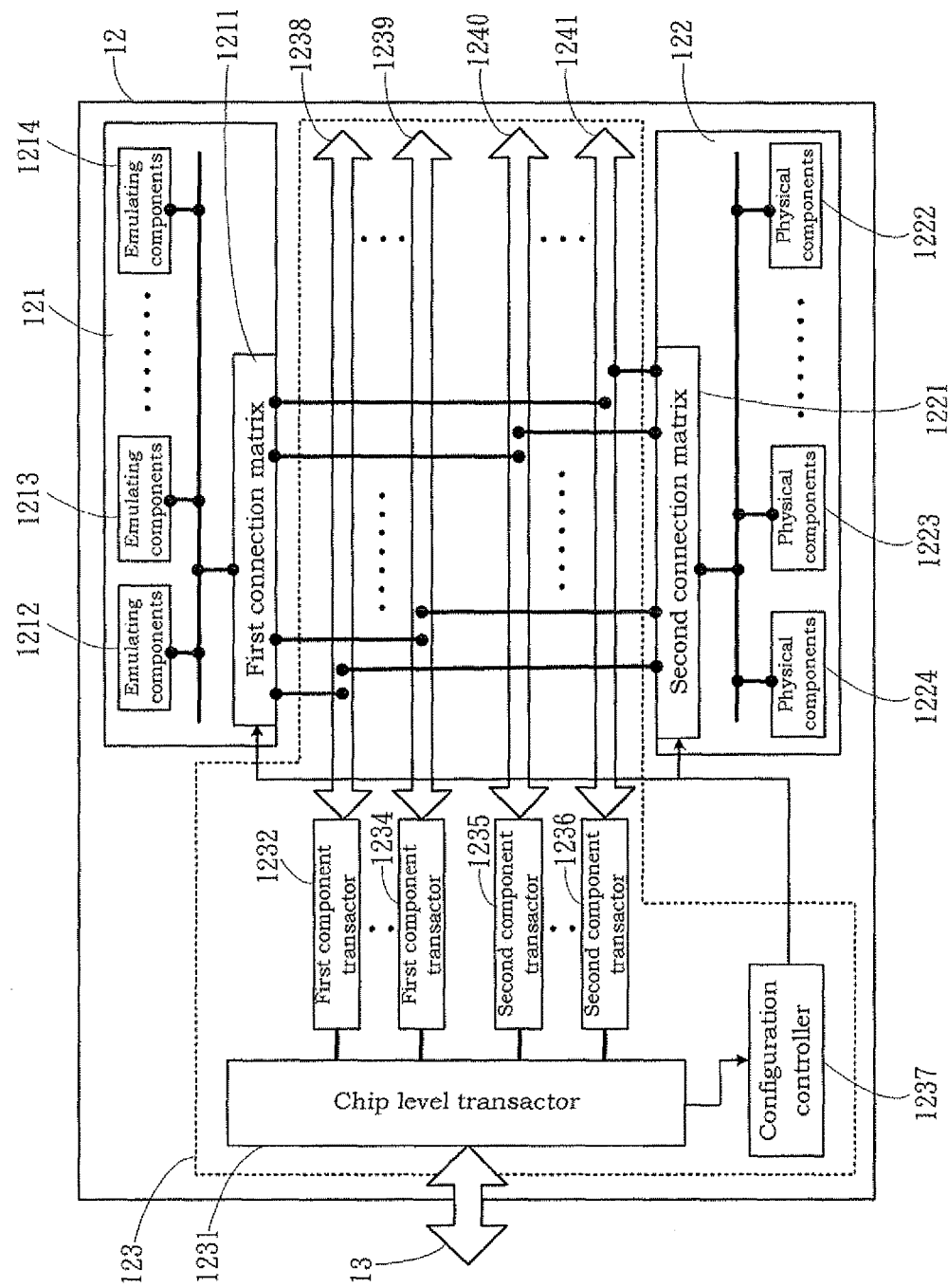
FIG. 2 is a graph illustrating the block diagram of the hybrid unit for a preferred embodiment of the invention

FIG. 2 is a graph illustrating the block diagram of the hybrid unit 12 for a preferred embodiment of the invention. As shown in FIG. 2, the hybrid unit 12 includes an emulating unit 121, a physical unit 122 and a reconfigurable connection matrix 123.

The emulating unit 121 includes a first connection matrix 1211 and a plurality of emulating component 1212, emulating component 1213. The above-mentioned emulating component 1212, emulating component 1213 connect the first connection matrix 1211. In the embodiment, the examples of emulating component 1212, emulating component 1213 are RTL IP nuclei.

The physical unit 122 includes a second connection matrix 1221 and a plurality of physical component 1222, physical component 1223. The above-mentioned physical component 1222 and physical component 1223 connect the second connection matrix 1221. In the embodiment, the examples of physical component 1222 and physical component 1223 are peripheral IP nuclei.

The reconfigurable connection matrix 123 includes a chip level transactor 1231, a plurality of first component transactor 1232, first component transactor 1234, a plurality of second component transactor 1235, second component transactor 1236, a configuration controller 1237 and a plurality of bus 1238 and bus 1239.

The above-mentioned chip level transactor 1231 connects the configuration controller 1237, a plurality of first component transactor 1232, first component transactor 1234 and a plurality of second component transactor 1235, second component transactor 1236. In addition, the above-mentioned bus 1238, bus 1239 connect the chip level transactor 1231 via the first component transactor 1232, first component transactor 1234. The emulating component 1212, emulating component 1213 connect the chip level transactor 1231 via the first connection matrix 1211, the bus 1238, bus 1239 and the first component transactor 1232, first component transactor 1234. The physical component 1222, physical component 1223 connect the chip level transactor 1231 via the second connection matrix 1221, the bus 1238, bus 1239 and the first component transactor 1232, first component transactor 1234. In the embodiment, the plurality of bus 1238 and bus 1239 are also called the system buses.

In addition, the emulating component 1212, emulating component 1213 connect the chip level transactor 1231 via the first connection matrix 1211 and the second component transactor 1235, second component transactor 1236. The physical component 1222, physical component 1223 connect the chip level transactor 1231 via the second connection matrix 1221 and the second component transactor 1235, second component transactor 1236.

The above-mentioned configuration controller 1237 further connects the first connection matrix 1211 and the second connection matrix 1221. The above-mentioned configuration controller 1237 can receive the control signal provided by the main workstation via the chip level transactor 1231, and control the operation of the first connection matrix 1211 and the second connection matrix 1221 in accordance with the control signal, in order to change the connection relation among the chip level transactor 1231, the first component transactor 1232, first component transactor 1234, the second component transactor 1235, second component transactor 1236, the bus 1238, bus 1239, the first connection matrix 1211, and the second connection matrix 1221.

In the embodiment, the configuration controller 1237 receives the above-mentioned control signal under system setup period, and changes the connection configuration of the first connection matrix 1211 and the second connection matrix 1221.

For example, the configuration controller 1237 can control the first connection matrix 1211, so that the first connection matrix 1211 only connects the bus 1239, and the first connection matrix 1211 connects the second connection matrix 1236 directly. The configuration controller 1237 can control the second connection matrix 1221, so that the second connection matrix 1221 does not connect the bus 1238, bus 1239, and not connect the second component transactor 1235, second component transactor 1236.

In the embodiment, the various connection relations between the virtual unit and the hybrid unit can be changed via the control signal. The examples of various connection relations will be described as follows, but it is not limited in the invention.

Figure 3:
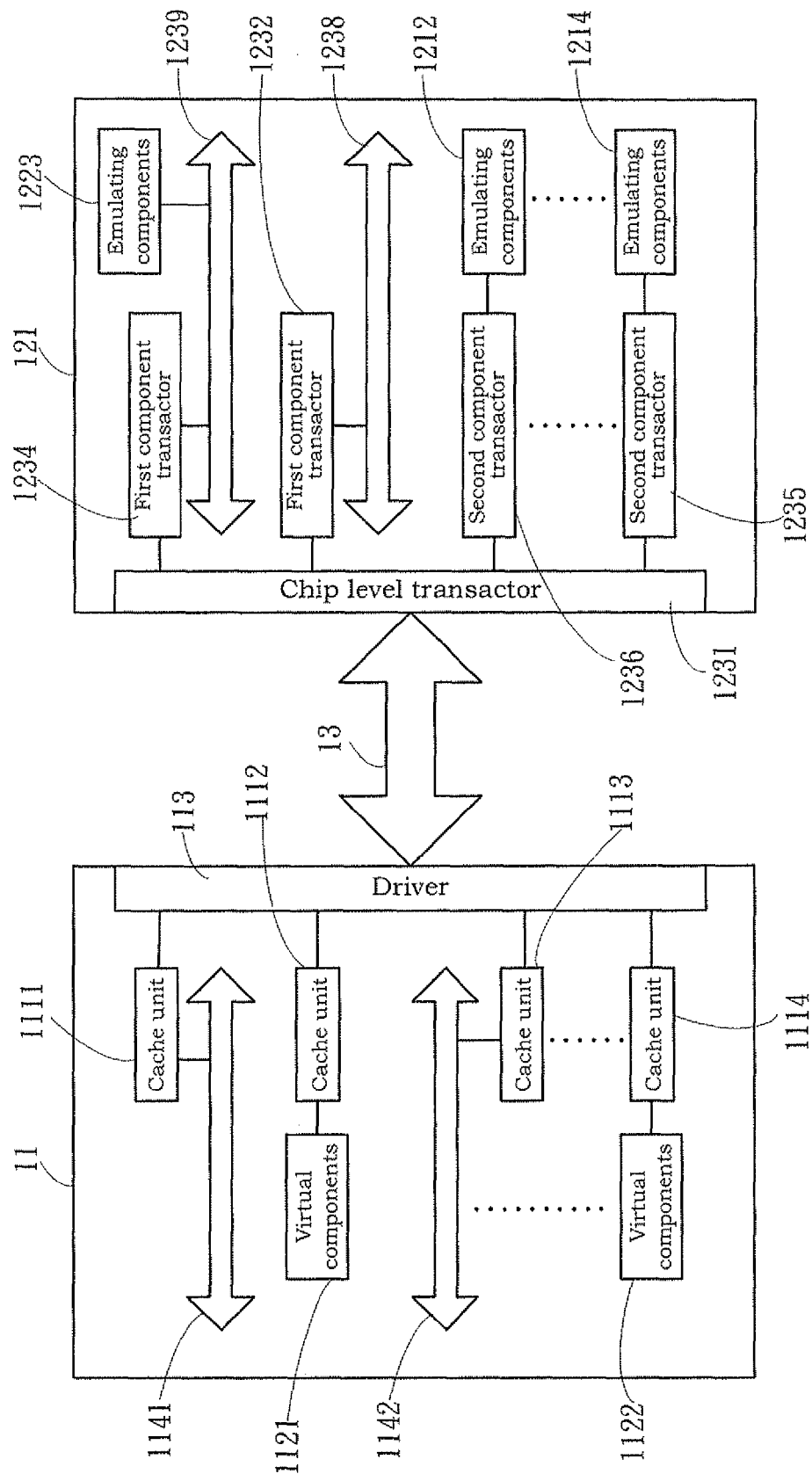
FIG. 3 is a graph illustrating a first connection relation between the virtual unit and the hybrid unit.

FIG. 3 is a graph illustrating a first connection relation between the virtual unit 11 and the hybrid unit 12. As shown in FIG. 3, the configuration controller can control the operation of the first connection matrix and the second connection matrix, so that the virtual unit 11 only connects the emulating unit 121, or the virtual unit 11 only connects the physical unit 122. In the embodiment, the emulating component 1212 can connect the chip level transactor 1231 via the second component transactor 1236. The emulating component 1213 can connect the first component transactor 1234 via the bus 1239, and the first component transactor 1234 connects the chip level transactor 1231.

As shown in FIG. 3, there are many connection ways, such as: I. The bus in the virtual unit 11 connects the bus in the emulating/physical unit; II. The virtual component connects the bus in the emulating/physical unit directly; III. The emulating/physical component connects the bus in the virtual unit 11 directly; and IV. The virtual component connects emulating/physical component in a point-to-point fashion.

Figure 4A:
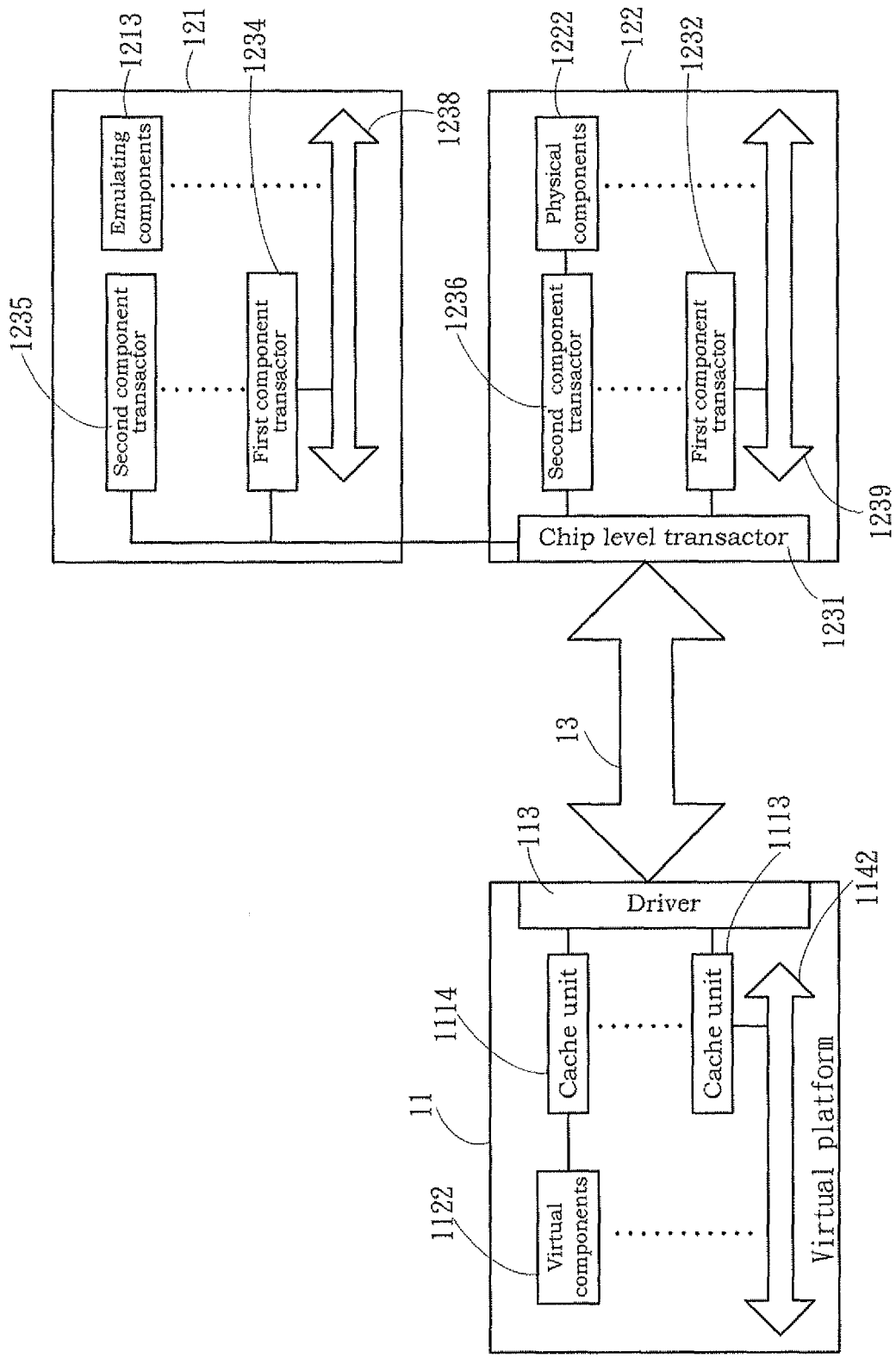
FIG. 4A and FIG. 4B are graphs illustrating a second connection relation between the virtual unit and the hybrid unit.
Figure 4B:
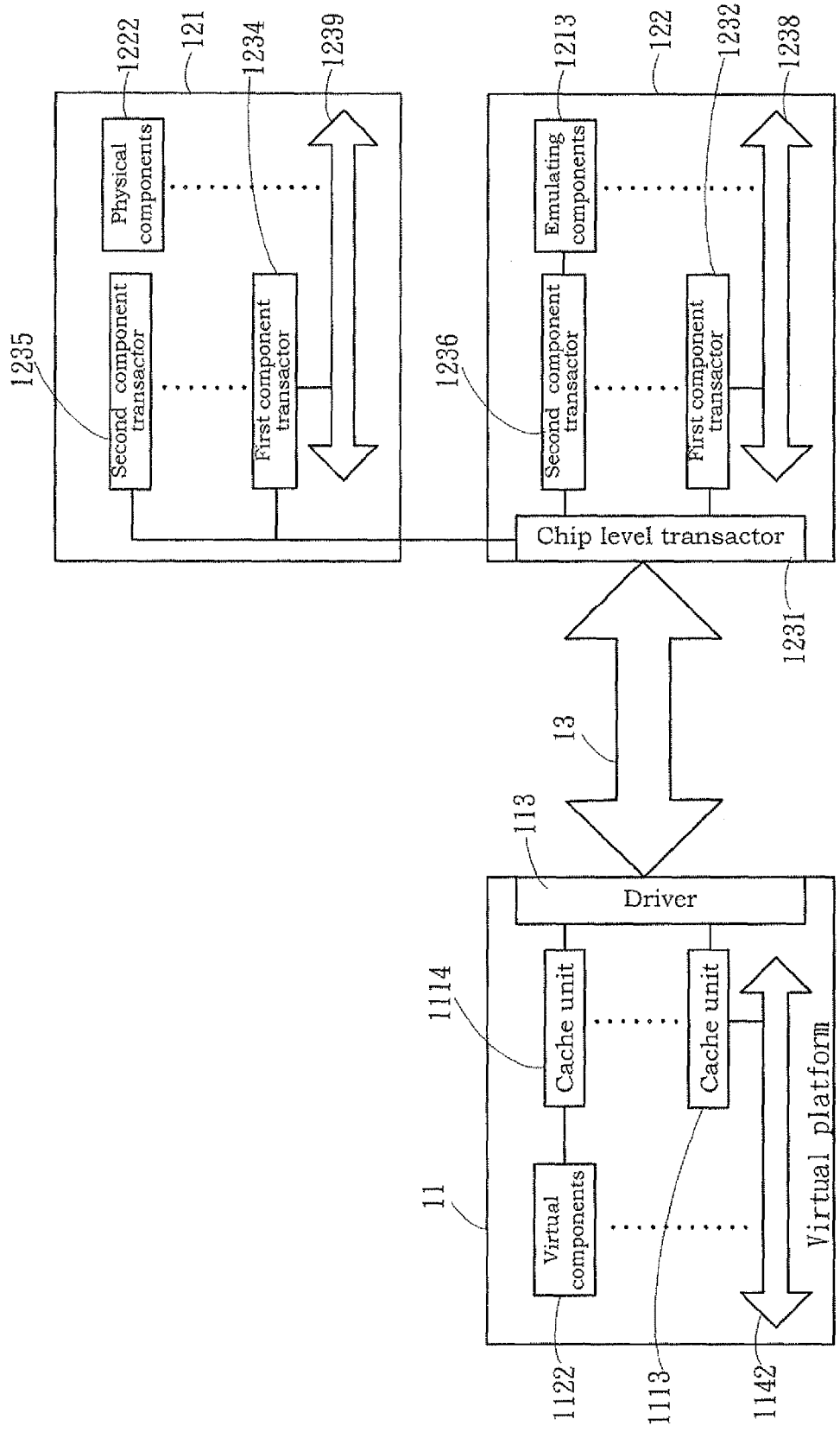

FIG. 4A and FIG. 4B are graphs illustrating a second connection relation between the virtual unit and the hybrid unit. As shown in FIG. 4A and FIG. 4B, the chip level transactor can be used as a bridge. For example, as shown in FIG. 4A, when only the physical unit 122 includes the chip level transactor 1231 and the emulating unit 121 does not include the chip level transactor 1231, the virtual unit 11 can connect the chip level transactor 1231 of the physical unit 122 via the communication channel 13, and the signal from the virtual unit 11 can be transferred to the component transactor of emulating unit 121 through the chip level transactor 1231 of the physical unit 122. That is, according to FIG. 4A, the physical unit 122 shares the chip level transactor 1231 with the emulating unit 121. However, when sharing the chip level transactor 1231, the component transactor of the emulating unit 121 must be electrically connected to the component transactor of the physical unit 122 for sharing. Similarly, FIG. 4B shows the same situation. The physical unit 122 shares the chip level transactor 1231 with the emulating unit 121. However, when sharing the chip level transactor 1231, the component transactor of the emulating unit 121 must be electrically connected to the component transactor of the physical unit 122 for sharing.

Figure 5:
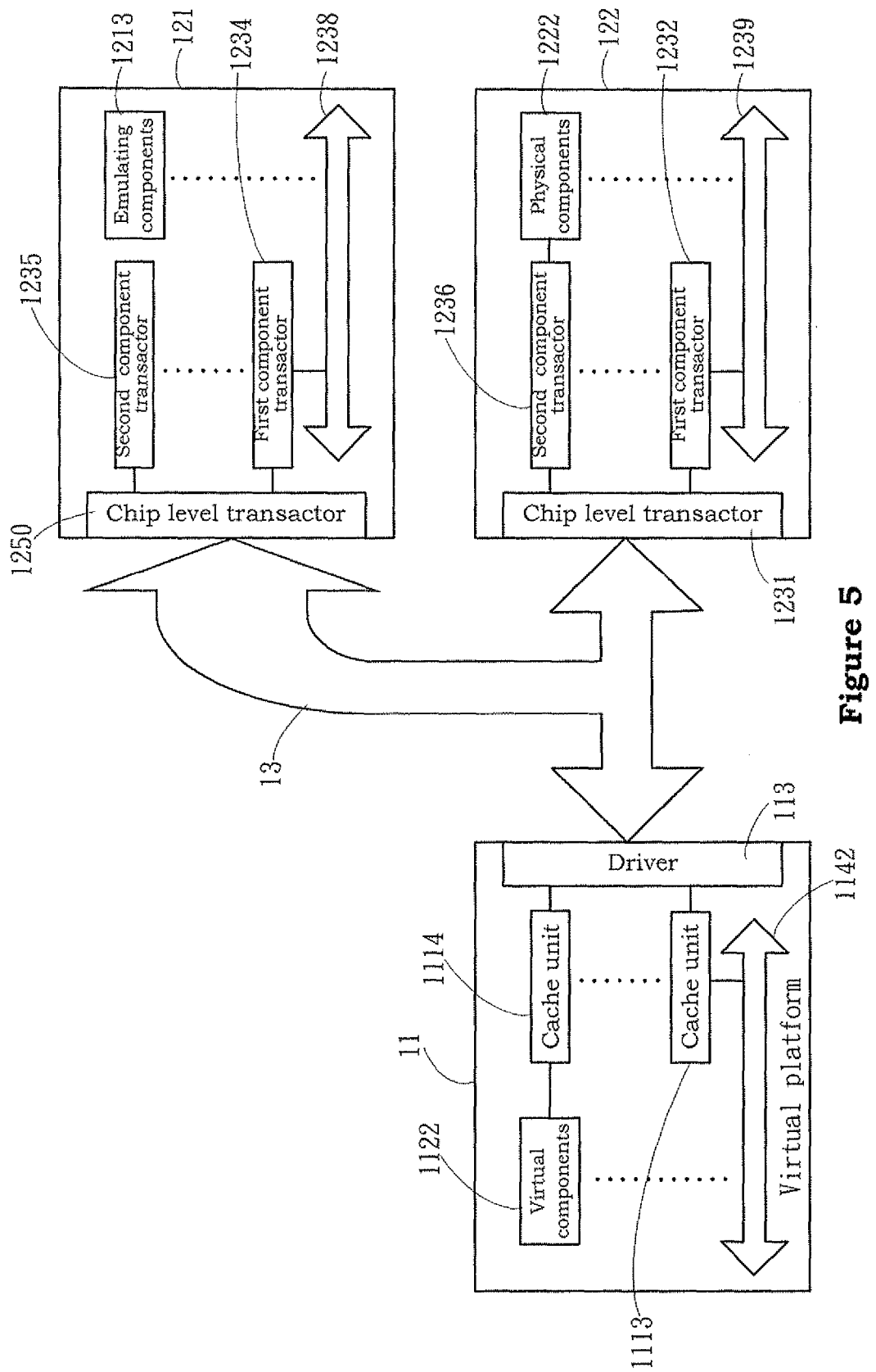
FIG. 5 is a graph illustrating a third connection relation between the virtual unit and the hybrid unit.

FIG. 5 is a graph illustrating a third connection relation between the virtual unit 11 and the hybrid unit 12. In the example, the emulating unit 121 has the chip level transactor 1250, and the physical unit 122 has the chip level transactor 1231. The virtual unit 11 connects the chip level transactor 1250 of the emulating unit 121 and the chip level transactor 1231 of the physical unit 122 respectively via the communication channel 13.

In summary, the preferred embodiment of the invention uses a hybrid platform to substitute the virtual platform, in order to implement ESL design algorithm. The preferred embodiment of the invention also provides a reconfigurable connection matrix to offer many connection ways among the virtual unit, the emulating unit and the physical unit. Certainly, adopting the preferred embodiment of the invention can retain the existing IP without using SystemC or TLM 2.0.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A hybrid electronic design system, comprising:
    a virtual unit, including a plurality of proxies, a plurality of virtual components and a driver, wherein the virtual components is connected to the driver via the plurality of proxies; and
    a hybrid unit, including an emulating unit, a physical unit and a chip level transactor, wherein the chip level transactor is connected to the emulating unit and the physical unit;
    wherein the emulating unit comprises a first connection matrix and a plurality of emulating components, and the emulating components connect to the first connection matrix; and
    wherein the hybrid unit comprises a plurality of second component transactors, the first connection matrix being connected to the chip level transactor via the plurality of second component transactors; and
    a communication channel for connecting the driver of the virtual unit with the chip level transactor of the hybrid unit.

2. The hybrid electronic design system according to claim 1, wherein the hybrid unit comprises a first component transactor and a bus, the bus being connected to the chip level transactor via the first component transactor.

3. The hybrid electronic design system according to claim 1, wherein the hybrid unit comprises a second component transactor with a component, the component being connected to the chip level transactor via the second component transactor.

4. The hybrid electronic design system according to claim 3, wherein the component is selected from the group of consisting of a physical unit and an emulating unit.

5. The hybrid electronic design system according to claim 1, wherein the hybrid unit further comprises a reconfigurable connection matrix, including:
    a configuration controller;
    a chip level transactor;
    a plurality of first component transactors; and
    a plurality of buses, wherein the chip level transactor connecting to the configuration controller, the plurality of first component transactors and the plurality second component transactors, and the plurality of first component transactors connect the buses.

6. The hybrid electronic design system according to claim 1, wherein the hybrid unit further comprises:
    a plurality of first component transactors; and
    a plurality of buses, wherein the first connection matrix being connected to the plurality of first component transactors via the plurality of buses, and the first plurality of component transactors being connected to the chip level transactor.

7. The hybrid electronic design system according to claim 1, wherein the hybrid unit further comprises a configuration controller, which connects to the chip level transactor and the first connection matrix.

8. A hybrid electronic design system, comprising:
    a virtual unit, including a plurality of proxies, a plurality of virtual components and a driver, the virtual components being connected to the driver via the plurality of proxies;
    a hybrid unit, including an emulating unit, a physical unit and a chip level transactor, wherein the chip level transactor is connected to the emulating unit and the physical unit;
    wherein the physical unit comprises a connection matrix and a plurality of physical components, and the plurality of physical components connecting to the connection matrix; and
    wherein the hybrid unit comprises a plurality of second component transactors, and the second connection matrix is connected to the chip level transactor via the plurality of second component transactors; and
    a communication channel for connecting the driver of the virtual unit with the chip level transactor of the hybrid unit.

9. The hybrid electronic design system according to claim 8, wherein the hybrid unit further comprises:
    a plurality of first component transactors; and
    a plurality of buses, wherein the connection matrix being connected to the plurality of first component transactors via the plurality of buses, and the first component transactors being connected to the chip level transactor.

\* \* \* \* \*